United States Patent [19]

Kawamura et al.

[11] Patent Number: 5,609,983
[45] Date of Patent: Mar. 11, 1997

[54] POSITIVE WORKING PHOTOSENSITIVE COMPOSITIONS

[75] Inventors: Koichi Kawamura; Kenichiro Sato; Shinji Sakaguchi, all of Shizuoka, Japan

[73] Assignee: Fuji Photo Film Co., Ltd., Kanagawa, Japan

[21] Appl. No.: 449,294

[22] Filed: May 24, 1995

[30] Foreign Application Priority Data

May 25, 1994 [JP] Japan .................................. 6-111441
Mar. 28, 1995 [JP] Japan .................................. 7-069586

[51] Int. Cl.$^6$ ........................................................ G03F 7/023
[52] U.S. Cl. ........................... 430/193; 430/191; 430/192; 534/557
[58] Field of Search .............................. 430/192, 193, 430/165, 191; 534/557

[56] References Cited

U.S. PATENT DOCUMENTS

| | | | |
|---|---|---|---|
| 2,766,118 | 10/1956 | Sus et al. ................................ | 430/192 |
| 2,975,053 | 3/1961 | Schmidt et al. ........................ | 430/192 |
| 3,902,906 | 9/1975 | Iwama et al. ........................... | 430/192 |
| 5,223,373 | 6/1993 | Lin et al. ................................ | 430/192 |

FOREIGN PATENT DOCUMENTS 4274431  9/1992  Japan .

*Primary Examiner*—John S. Chu
*Attorney, Agent, or Firm*—Sughrue, Mion, Zinn, Macpeak & Seas

[57] ABSTRACT

There is provided a positive working photosensitive composition suitable for photosensitive lithographic printing plate or photoresist for fine processing, which comprises a quinonediazide ester compound having the structure characterized by containing in the same molecule both quinonediazide structure and N-sulfonylamide [—C(=O)—NHSO$_2$—] or sulfonamide [—NHSO$_2$—] structure which are positioned independently of each other.

7 Claims, No Drawings

POSITIVE WORKING PHOTOSENSITIVE COMPOSITIONS

FIELD OF THE INVENTION

The present invention relates to photosensitive compositions suitable for the production of lithographic printing plates, IC circuits and photomasks. More particular, it concerns the positive working photosensitive compositions which comprise a positive working photosensitive material and a high molecular compound soluble in an alkaline aqueous solution or an alkaline solvent mainly containing water (which is called "an alkaline water-soluble high molecular compound" hereinafter).

The positive working photosensitive compositions according to the present invention are particularly useful as photosensitive materials for lithographic printing plates and positive photoresists for fine processing.

BACKGROUND OF THE INVENTION

A composition which contains an alkali-soluble resin, such as novolak resin, and a quinonediazide compound as photosensitive material is generally used as a photosensitive composition for lithographic printing plate or a positive photoresist composition for fine processing. Hitherto, a great number of photosensitive compositions of the type which contain an alkali-soluble resin and a quinonediazide compound have been developed. Some instances of them are described in A. Reiser, *Photoreactive Polymers*, John Wiley & Sons (1989).

As those photosensitive compositions can withstand some levels of practical use, they have so far been used as photosensitive compositions for lithographic printing plates and resists for fine processing. In the present situation, however, it is required of a photosensitive composition for lithographic printing plate to have higher sensitivity and exhibit better development latitude than ever.

Also, a resist for fine processing is now in the circumstances that higher resolution and image reproduction better in pattern shape than ever are required thereof.

In order to heighten resolution and reproduce images with a good pattern shape, it has so far been thought that the use of a resist having high contrast (γ value) is advantageous. Therefore, resist-composition arts which can answer the aforementioned purpose have been developed. Such arts are disclosed in a great number of publications. As for the novolak resin in particular, which constitutes the main part of positive photoresist, a great deal of patents have been applied for its monomer composition, molecular weight distribution, synthetic method and so on, and have brought passable results. As for the photosensitive material also, which is the other main component, there have been disclosed the compounds with various structures which have been regarded as effective for increasing the contrast.

The 1,2-naphthoquinonediazide compounds of polyhydroxy compounds having certain specific structures have been proposed in large numbers for the purpose of heightening the resolution. For instance, such compounds are disclosed in JP-A-57-63526 (the term "JP-A" as used herein means an "unexamined published Japanese patent application), JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JP-A-3-48250, JP-A-3-158856, JP-A-3-228057, JP-A-4-502519, U.S. Pat. Nos. 4,957,846, 4,992,356, 5,151,340, and 5,178,986, European Patent 530,148, and so on. Although those photosensitive materials were successful in heightening the resolution, they left the sensitivity insufficient.

SUMMARY OF THE INVENTION

A first object of the present invention is to provide photosensitive compositions suitable for lithographic printing plate with high sensitivity and good development latitude.

A second object of the present invention is to provide positive photoresist compositions for superfine processing which have high sensitivity and high resolution.

As a result of our intensive studies carried on while giving heed to the characteristics as described above, it has now been found that the foregoing problems can be solved by using a novel quinonediazide ester compound containing a certain specific acid group, thereby achieving the present invention.

That is, the objects of the present invention can be attained with the constitutions described below:

(1) A positive working photosensitive composition, comprising a quinonediazide ester compound represented by the following general formula (I) wherein at least one quinonediazide structure and at least one N-sulfonylamide structure [—C(=O)—NHSO$_2$—] are contained independently of each other:

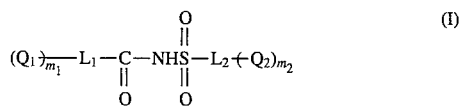

wherein $L_1$ and $L_2$ each represent an unsubstituted or substituted polyvalent linkage group which consists of non-metallic atoms; $Q_1$ and $Q_2$ each represent a hydrogen atom or a quinonediazide structure; $m_1$ and $m_2$ each represent an integer from 1 to 15; provided that at least one $Q_1$ or $Q_2$ group represents a quinonediazide structure.

(2) A positive working photosensitive composition, comprising a quinonediazide ester compound represented by the following general formula (II) wherein at least one quinonediazide structure and at least one sulfonamide structure [—NHSO$_2$—] are contained independently of each other and the proportion of the sulfonamide structure to the quinonediazide structure is greater than 1/3 and not greater than 1, namely 1/3<sulfonamide structure/quinonediazide structure ≦1:

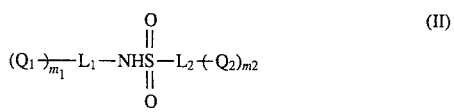

wherein $L_1$, $L_2$, $Q_1$, $Q_2$, $m_1$ and $m_2$ have the same meanings as in the foregoing general formula (I), respectively.

The N-sulfonylamide structure [—C(=O)—NHSO$_2$—] in general formula (I) and the sulfonamide structure [—NHSO$_2$—] in general formula (II) are both acidic groups. Since these acidic groups and photosensitive quinonediazide structures are present independently of one another in individual molecular structures, the compounds illustrated above can exhibit excellent performance to solve the aforementioned problems.

DETAILED DESCRIPTION OF THE INVENTION

As for the quinonediazide structures which can be introduced into the foregoing compounds, most of the quinonediazides described in V. V. Ershov, *Quinone Diazides*, Elsevier (1981) can be adopted. In particular, 1,2-naphthoquinonediazide and 2,1-naphthoquinonediazide are preferable over the others.

The expression "an N-sulfonylamide structure and a quinonediazide structure are present independently of each other" or "a sulfonamide structure and a quinonediazide structure are present independently of each other" signifies that the quinonediazide structure, specifically a benzoquinonediazide or a naphthoquinonediazide, and the sulfonamide or N-sulfonylamide structure are not connected directly to each other, but they are bonded to each other via a polyvalent linkage group consisting of nonmetallic atoms including at least one carbon atom.

The number of quinonediazide structures present in a molecule is at least one, preferably in the range of 1 to 15, and more preferably in the range of 1 to 10. The number of N-sulfonylamide structural units present in a molecule of general formula (I) and that of sulfonamide structural units present in a molecule of general formula (II) are each at least one, preferably in the range of 1 to 10, more preferably in the range of 1 to 6, and particularly preferably in the range of 1 to 4.

In general formula (I), the proportion of the quinonediazide structures to the N-sulfonylamide structural units in the same molecule is in the range of 1/2 to 15/1, preferably from 1/1 to 10/1, expressed in the form of (the number of quinonediazide structures)/(the number of N-sulfonylamide structural units) ratio. In particular, the range of 2/1 to 8/1 is favored. As far as the ratio is in the above-described ravage, the resulting composition is well balanced between the sensitivity and the development latitude or resolution. When the proportion of the quinonediazide structures is small, the coating of the resulting composition causes remarkable film thickness loss, thereby deteriorating the development latitude or resolution. Conversely, a large proportion of quinonediazide structure causes marked reduction in sensitivity to fail to achieve the effect of the present invention.

As for the proportion of the sulfonamide structural units to the quinonediazide structures in general formula (II), there holds the relation, $1/3 <$ (sulfonamide structural units)/(quinonediazide structures) $\leq 1$, expressed in the form of (the number of sulfonamide structural units)/(the number of quinonediazide structures) ratio. Preferably, the foregoing ratio ranges from 2/5 to 1. When the ratio is in the foregoing range, the resulting composition is well balanced between the sensitivity and the development latitude or the resolution.

The novel quinonediazide compounds according to the present invention, which are represented by general formulae (I) and (II) respectively, may have certain substituent group(s), other than the N-sulfonylamide structure in general formula (I) and the sulfonamide structure in general formula (II). Suitable examples of such a substituent group include a hydroxyl group, a carboxyl group, a carbonyl group, an acyloxy group such as acetoxy (preferably, one which contains 1 to 6 carbon atoms), an alkoxy group such as methoxy, ethoxy, etc. (preferably one which contains 1 to 6 carbon atoms), a halogen atom such as chlorine, bromine, etc., an alkyl group such as methyl, ethyl, etc. (preferably, one which contains 1 to 20 carbon atoms), and an aromatic group such as phenyl (preferably, one which contains 6 to 16 carbon atoms).

Of the novel quinonediazide compounds represented by the present formulae (I) and (II), those which have low molecular weight are used to advantage. The term "low molecular weight" as used herein is intended to lie in the range of 400 to 5,000, preferably 500 to 3,000.

In the formulae (I) and (II), $L_1$ and $L_2$ are independent of each other, and each of them represents an unsubstituted or substituted polyvalent linkage group which consists of nonmetallic atoms. $Q_1$ and $Q_2$ are also independent of each other, and each of them represents a hydrogen atom or a quinonediazide structure, and $m_1$ and $m_2$ represent an integer of from 1 to 15 independently of each other. Therein, however, it is required of at least one of $Q_1$ and $Q_2$ to be a quinonediazide structure.

The polyvalent linkage group represented by $L_1$ and $L_2$ each, which may be substituted or not, is constituted of from 1 to 60 carbon atoms, from 0 to 10 nitrogen atoms, from 0 to 50 oxygen atoms, from 1 to 100 hydrogen atoms and from 0 to 20 sulfur atoms. More specifically, examples of such a linkage group include those formed by combining some of the following structural units:

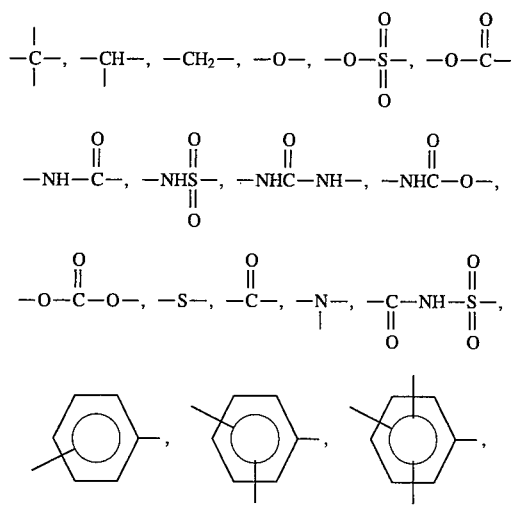

a polyvalent naphthalene, and a polyvalent anthracene. As for the substituent group which the polyvalent linkage group can contain, there can be instanced an alkyl group containing 1 to 20 carbon atoms, such as methyl, ethyl, etc., an aromatic group containing 6 to 16 carbon atoms, such as phenyl, naphthyl, etc., a hydroxyl group, a carboxyl group, a sulfonamido group, an N-sulfonylamido group, an acyloxy group containing 1 to 6 carbon atoms such as acetoxy, etc., an alkoxy group containing 1 to 6 carbon atoms, such as methoxy, ethoxy, etc., a halogen atom such as chlorine, bromine, etc., an alkoxycarbonyl group containing 2 to 7 carbon atoms, such as methoxycarbonyl, ethoxycarbonyl, cyclohexyloxycarbonyl, etc., a cyano group, a carbonate group such as t-butyl carbonate, etc., and so on. Of the novel quinonediazide compounds represented by general formula (I), particularly preferable compounds are those represented by the general formula (III) illustrated below. Of the novel quinonediazide compounds represented by general formula (II), on the other hand, those represented by the following general formula (IV) are preferred in particular.

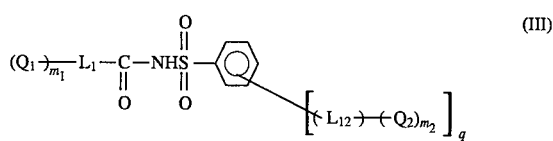

(III)

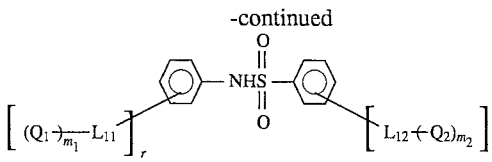

In the above formulae (III) and (IV), $Q_1$, $Q_2$, $L_1$, $m_1$ and $m_2$ have the same meanings as in general formula (I), respectively. q and r are independent of each other, and each of them represents an integer of from 0 to 5. However, the case of q=r=0 is excluded therefrom. $L_{11}$ and $L_{12}$ are each a polyvalent linkage group consisting of nonmetallic atoms, which may contain a substituent group. More specifically, the polyvalent linkage group is constituted of from 0 to 60 carbon atoms, from 0 to 10 nitrogen atom, from 0 to 50 oxygen atoms, from 0 to 100 hydrogen atoms and from 0 to 20 sulfur atoms. When the number of carbon atom, that of nitrogen atom, of oxygen atom, that of hydrogen atom and that of sulfur atom are all zero, $L_{11}$ and $L_{12}$ each represent a single bond.

Specific examples of a linkage group represented by $L_{11}$ and $L_{12}$ each, excepting a single bond, include the same structural units as shown in the foregoing illustration of $L_1$ and $L_2$ and those formed by combining some of those structural units.

When the polyvalent linkage group represented by $L_{11}$ or $L_2$ contain a substituent group, examples of such a substituent group include the same groups as the foregoing polyvalent linkage groups represented by $L_1$ and $L_2$ can contain as a substituent.

The molecular weight of the compound represented by general formula (III) or (IV) ranges from 400 to 5,000, preferably from 500 to 3,000.

In general formula (III), the proportion of the quinonediazide structures to the N-sulfonylamide structural units ranges from 1/2 to 15/1, preferably from 1/1 to 10/1, expressed in the form of the (number of quinonediazide structures)/(number of N-sulfonylamide structural unit) ratio. In particular, the range of 2/1 to 8/1 in terms of the foregoing ratio is favored. As far as the ratio is in the above-described range, the resulting composition is well balanced between the sensitivity and the development latitude or resolution. When the proportion of the quinonediazide structures is small, the coating of the resulting composition causes remarkable film thickness loss, thereby deteriorating the development latitude or resolution. Conversely, a large proportion of quinonediazide structures causes marked reduction in sensitivity to fail to achieve the effect of the present invention.

As for the proportion of the sulfonamide structural units to the quinonediazide structures in general formula (IV), there holds the relation, 1/3<(number of sulfonamide structural units)/(number of quinonediazide structures)≦1. Preferably, the foregoing ratio is in the range of 2/5 to 1/1. When the ratio is in the foregoing range, the resulting composition is well balanced between the sensitivity and the development latitude or the resolution. When the proportion of the quinonediazide structures is small, the coating of the resulting composition causes remarkable film thickness loss, thereby deteriorating the development latitude or resolution; while when it is large, marked reduction in sensitivity is caused to make it impossible to achieve the effect of the present invention.

Specific examples of novel compounds represented by general formulae (I) to (IV) according to the present invention are illustrated below. However, the present invention should not be construed as being limited to these examples. In the specific examples shown below, $D_1$ represents the 1,2-naphthoquinonediazido-5-sulfonyl structure illustrated below, and $D_2$ represents the 1,2-naphthoquinonediazido-4-sulfonyl structure illustrated below:

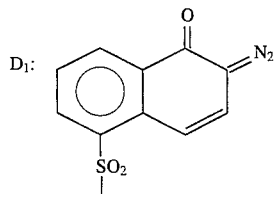

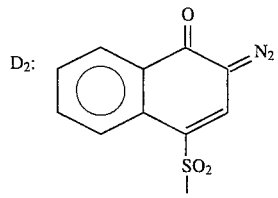

The compounds shown below are specific examples of general formulae (I) to (IV).

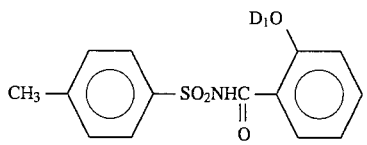

1.

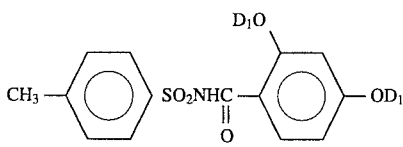

2.

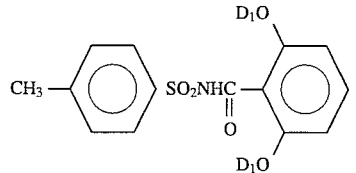

3.

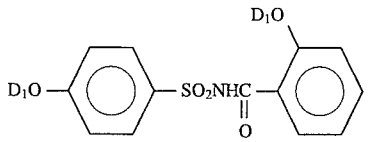

4.

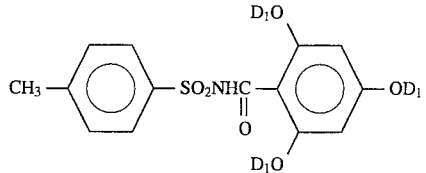

5.

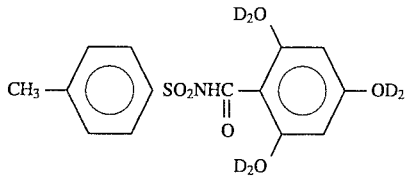

6.

-continued
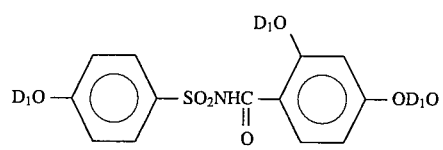
7.
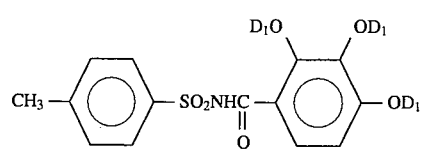
8.
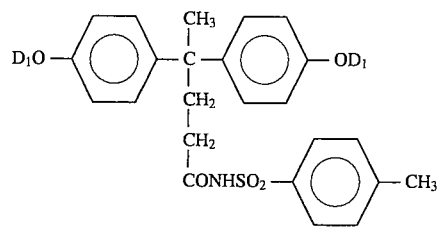
9.
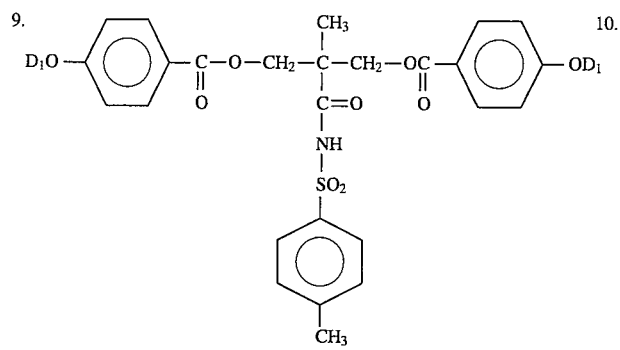
10.
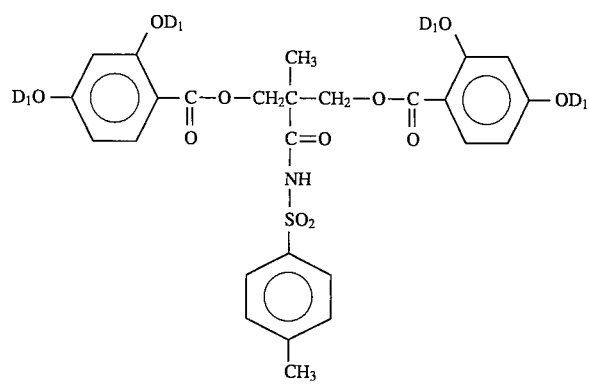
11.
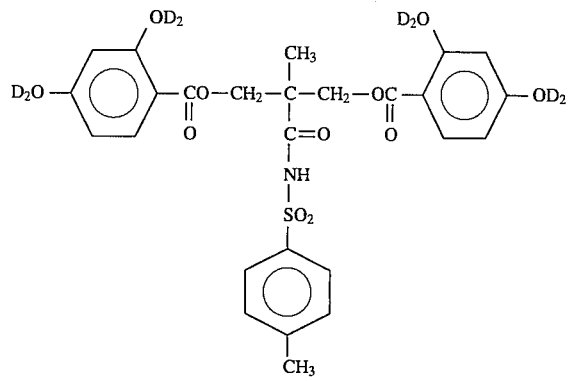
12.
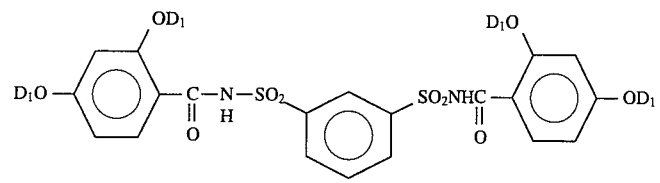
13.

14.
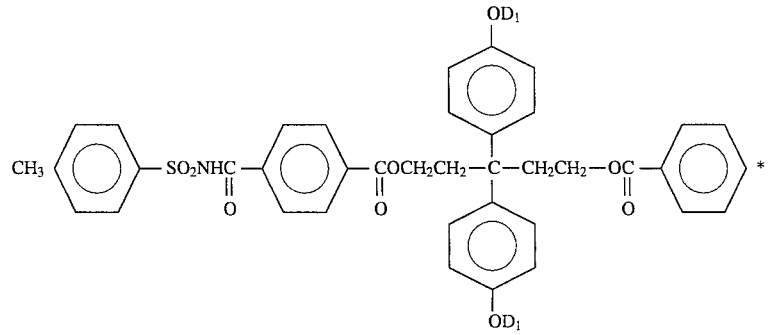
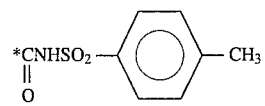
15.
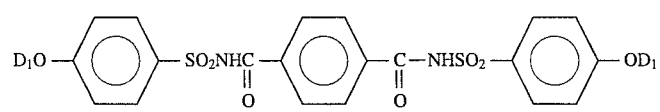
16.
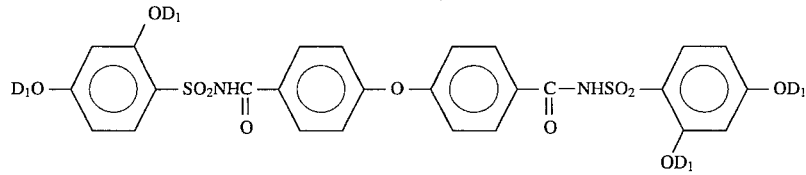
17.
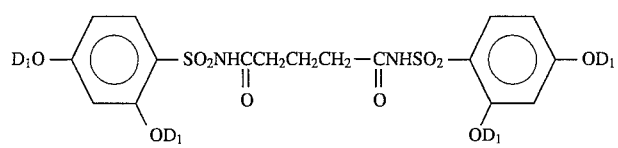
18.
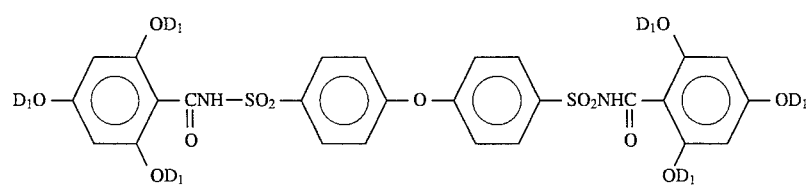
19.
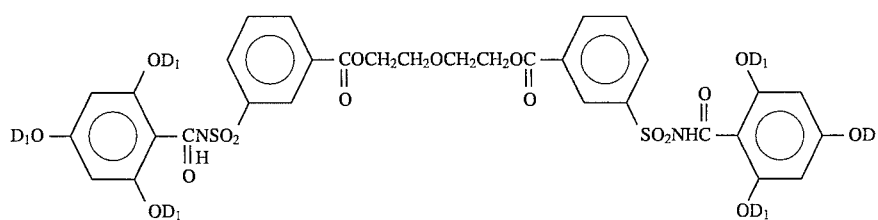
20.
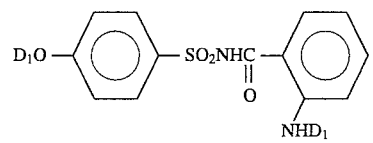
21.
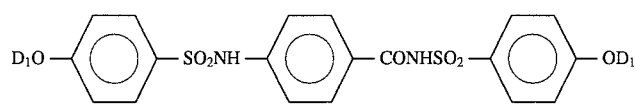
22.
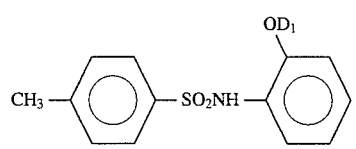
23.
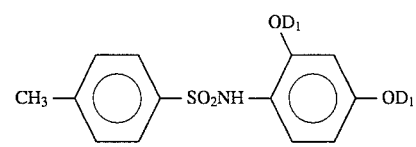

-continued

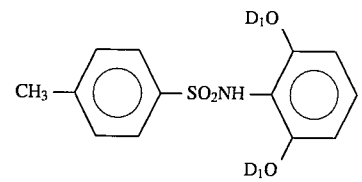
24.

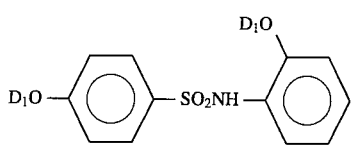
25.

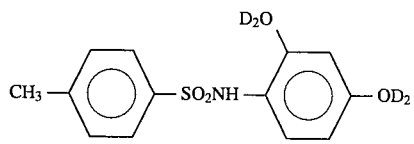
26.

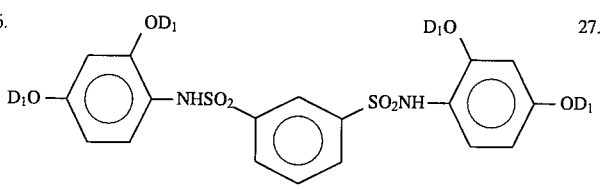
27.

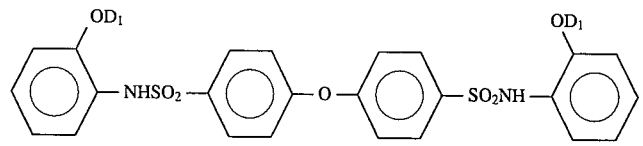
28.

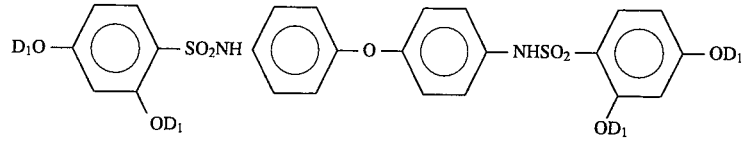
29.

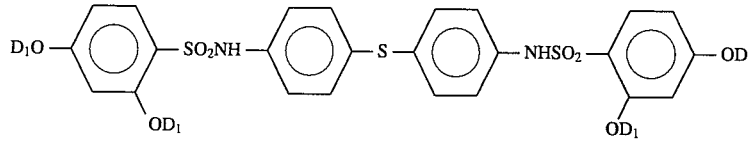
30.

The compounds of the present invention can be obtained, e.g., by subjecting a hydroxy compound or a polyhydroxy compound and 1,2-naphthoquinonediazido-5-(and/or -4-)sulfonyl chloride to the esterification reaction in the presence of a basic catalyst.

More specifically, a (poly)hydroxy compound, 1,2-naphthoquinonediazido-5-(and/or -4-)sulfonyl chloride and a solvent (e.g., dioxane, acetone, methyl ethyl ketone, N-methylpyrrolidone, chloroform, trichloroethane, trichloroethylene, dichloroethane) are placed in a flask in the amounts prescribed respectively, and thereinto is dripped a basic catalyst (e.g., sodium hydroxide, sodium carbonate, sodium hydrogen carbonate, triethylamine) to effect condensation. The product obtained is washed, purified and then dried.

The reaction temperature ranges generally from −20° C. to 60° C., and preferably from 0° to 40° C.

In the reaction of a polyhydroxy compound with a naphthoquinonediazidosulfonyl chloride, some of the hydroxy groups of the starting material remain unesterified according to the synthesis condition, and so compounds different in number and position of esterification are produced as a mixture.

If one or more of a quinonediazide structural unit is introduced in the product molecule even though hydroxy group(s) of the starting material remain in the product molecule, the product serves the novel photosensitive material of the present invention.

Further, even if the product contains hydroxy group(s) which have remained unesterified in each molecule thereof and is obtained as a mixture of compounds different in esterified position to which a quinonediazide is attached, this mixture serves the novel photosensitive material of the present invention.

The following description relates to embodiments of the present positive working photosensitive compositions in lithographic printing.

The present photosensitive compounds can be used without or with resins. In using them as a resinous composition, the present photosensitive compounds are blended with an alkali-soluble resin independently or in the form of mixture of two or more thereof. The amount of the compound(s) blended is in the range of 5 to 100 parts by weight, preferably 20 to 60 parts by weight, per 100 parts by weight of alkali-soluble resin.

Further, the present photosensitive material may be used together with conventional photosensitive materials, if desired. Specifically, it can be used together with, for instance, the esters prepared from 1,2-diazonaphthoquinonesulfonic acid chloride and pyrogallol-acetone resins as disclosed in JP-B-43-28403, the esters prepared from 1,2-diazonaphthoquinone-5-sulfonic acid chloride and phenolformaldehyde resins as disclosed in U.S. Pat. Nos. 3,046,120 and 3,188,210, the esters prepared from 1,2-diazoquinone-4-sulfonic acid chloride and phenolformaldehyde resins as disclosed in JP-A-2-96163, JP-A-2-96165 and JP-A-2-96761, and those disclosed in JP-A-47-5303, JP-A-48-63802, JP-A-48-63803, JP-A-48-96575, JP-A-49-38701, JP-A-48-13354, JP-B-37-18015, JP-B-41-11222, JP-B-45-9610, JP-B-49-17481 (the term "JP-B" as used herein means an "examined Japanese patent publication"), U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, German Patent 854,890, and so on.

Such a conventional photosensitive compound can be used in a proportion of 1 to 100 parts by weight, preferably 5 to 30 parts by weight, to 100 parts by weight of the present photosensitive material.

As for the alkali-soluble resins which can be used in the present invention, any of resins having such a property can be used. The alkali-soluble resins preferred in the present invention are novolak resins, with examples including phenol-formaldehyde resins and cresol-formaldehyde resins such as m-cresol-formaldehyde resins, p-cresol-formaldehyde resins, o-cresol-formaldehyde resins, m-cresol/p-cresol mixture-formaldehyde resins, phenol/cresol mixture-formaldehyde resins (wherein the cresol may be m-, p- or o-cresol, or a m-cresol/p-cresol mixture or a m-cresol/o-cresol mixture), etc. In addition, resol type phenol resins can be suitably used, and phenol/cresol mixture-formaldehyde resins (wherein the cresol may be m-, p- or o-cresol, or a m-cresol/p-cresol mixture or a m-cresol/o-cresol mixture) are preferable. In particular, the phenol resins disclosed in JP-A-61-217034 are favored.

Also, the arts disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, JP-A-4-122938 and so on, that is, novolak resins free from low molecular weight components or containing them in a reduced proportion, may be used.

Further, there can be used other various alkali-soluble high molecular compounds, such as phenol-modified xylene resins, polyhydroxystyrenes, polyhalogenated hydroxystyrenes, the phenolic hydroxy group-containing acrylic resins as disclosed in JP-A-51-34711, the sulfonamido group-containing acrylic resins disclosed in JP-A-2-866, the N-sulfonylamido group-containing acrylic resins and urethane resins disclosed in JP-A-63-226641 and Japanese Patent Application No. 5-170484, and so on. It is desirable that those alkali-soluble high molecular compounds have a weight-average molecular weight of 500 to 20,000 and a number-average molecular weight of 200 to 6,000.

The alkali-soluble high molecular compounds as cited above may be used alone or as a mixture of two or more thereof, and they are added in a proportion of no more than 80% by weight to the whole composition.

Furthermore, as disclosed in U.S. Pat. No. 4,123,279, the combined use with the condensates of phenols containing a $C_{3-8}$ alkyl group as a substituent and formaldehyde, such as t-butylphenol-formaldehyde resins and octylphenol-formaldehyde resins, are advantageous in view of improvement in ink receptivity of images.

For the purpose of heightening the sensitivity, it is desirable that cyclic acid anhydrides, phenols and organic acids be added to the photosensitive compositions of the present invention.

Specific examples of a cyclic acid anhydride include phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, pyromellitic anhydride and so on, as described in U.S. Pat. No. 4,115,128.

As for the phenols, bisphenol A, p-nitrophenol, p-ethoxyphenol, 2,3,4-trihydroxybenzophenone, 4-hydroxybenzophenone, 2,4,4'-trihydroxybenzophenone, 4,4,4"-trihydroxy-triphenylmethane, 4,4',3",4"'-tetrahydroxy-3,5,3',5'-tetramethyltriphenylmethane and the like are examples thereof.

As for the organic acids, there can be instanced those disclosed in JP-A-60-88942, JP-A-2-96755 and so on, such as sulfonic acids, sulfinic acids, alkylsulfuric acids, phosphonic acids, phosphinic acids, phosphates and carboxylates. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluylic acid, 3,4-dimethoxybenzoic acid, phthalic acid, terephthalic acid, 1,4-cyclohexene-2,2-dicarboxylic acid, erucic acid, lauric acid, n-undecanoic acid, ascorbic acid and so on.

The proportion of the foregoing cyclic acid anhydrides, phenols and organic acids in the photosensitive composition ranges preferably from 0.05 to 15% by weight, particularly preferably from 0.1 to 5% by weight.

In order to extend the development latitude, the nonionic surfactants as disclosed in JP-A-62-251740 and JP-A-4-68355 and the amphoteric surfactants as disclosed in JP-A-59-121044 and JP-A-4-13149 can be added to the present photosensitive composition.

As for the nonionic surfactants, sorbitan tristearate, sorbitan monopalmitate, sorbitan trioleate, stearic acid monoglyceride, polyoxyethylene sorbitan monooleate and polyoxyethylene nonylphenyl ether are specific examples thereof. As for the amphoteric surfactants, alkyl(diaminoethyl) glycines, alkylpolyaminoethylglycine hydrochlorides, Amogen K (trade name of an amphoteric surfactant of N-tetradecyl-N,N-betaine type, the product of Dai-ich Kogyo Co., Ltd.), 2-alkyl-N-carboxyethyl-N-hydroxyethylimidazolinium betaines and Lebon 15 (trade name of an amphoteric surfactant of alkylimidazoline type, the product of Sanyo Chemical Industries Co., Ltd.) are specific examples thereof.

The proportion of the aforementioned nonionic surfactants and amphoteric surfactants to the photosensitive composition ranges from 0.05 to 15% by weight, preferably from 0.1 to 5% by weight.

To the present photosensitive composition, dyes and other fillers as printing-out agent or image coloring agent for visualizing images just after exposure can further be added.

As a typical example of the printing-out agent for producing a visual image just after exposure, mention may be made of the combination of a photosensitive compound capable of releasing an acid upon exposure with an organic dye capable of forming a salt.

Various compounds have been proposed as the photosensitive compound capable of releasing an acid upon exposure. Specifically, there are proposed o-naphthoquinonediazido-4-sulfonic acid halogenides in JP-A-50-36209, trihalomethyl-2-pyrones and halomethyltriazines in JP-A-53-36223, various o-naphthoquinonediazide compounds in JP-A-55-62444, 2-trihalomethyl-5-aryl-1,3,4-oxadiazole compounds in JP-A-55-77742, and so on.

As for the organic dyes capable of changing their color tones by undergoing an interaction with the photolysis products of the above-cited compounds, there can be instanced the dyes of diphenylmethane, triarylmethane, thiazine, oxazine, phenazine, xanthene, anthraquinone, iminonaphthoquinone and azomethine types. Specific examples of such dyes include Brilliant Green, Eosine, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Metanil Yellow, Thymolsulfophthalein, Xylenol Blue, Methyl Orange, Orange IV, diphenyl thiocarbazone, 2,7-dichlorofluorescein, Para Methyl Red, Congo Red, Benzopurpurine 4B, α-Naphthyl Red, Nile Blue A, phenacetarin, Methyl Violet, Malachite Green, Para Fuchsine, Oil Blue #603 (produced by Orient Kagaku Kogyo K. K.), Oil Pink #312 (produced by Orient Kagaku Kogyo K. K.) Oil Red 5B (produced by Orient Kagaku Kogyo K. K.), Oil Scarlet #308 (produced by Orient Kagaku Kogyo K. K.), Oil Red OG (produced by Orient Kagaku Kogyo K. K.), Oil Red RR (produced by Orient Kagaku Kogyo K. K.), Oil Green #502 (produced by Orient Kagaku Kogyo K. K.), Spiron Red BEH Special (produced by Hodogaya Chemical Co., Ltd.), Victoria Pure Blue BOH (produced by Hodogaya Chemical Co., Ltd.), Patent Pure Blue (produced by Sumitomo Mikuni Chemical Co., Ltd.), Sudan Blue II (produced by BASF Co.), m-cresol purple, Cresol Red, Rhodamine B, Rhodamine 6G, Fast Acid Violet R, Sulfo Rhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylamino-phenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazoline, 1-β-naphthyl-4-p-diethylaminophenylimino-5-pyrazolone, and so on.

Particularly useful dyes are Victoria Pure Blue disclosed in JP-A-62-293247 and the dyes obtained by replacing the counter anions of basic dyes, such as Ethyl Violet, with organic sulfonic acids.

Suitable examples of a solvent which can be used for dissolving the present photosensitive materials, alkali-soluble resins and the foregoing ingredients include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, 1-methoxy-2-propanol, 1-methoxy-2-propylacetate, acetone, methanol, ethanol, water, isopropanol, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate and so on. These organic solvents are used alone or as a mixture of two or more thereof.

In using those organic solvent, they can further be mixed with high boiling solvents such as N-methylformamide, N,N-dimethylformamide, N-methylacetamide, N,N-dimethylacetamide, N-methylpyrrolidone, dimethyl sulfoxide, benzyl ethyl ether and the like.

To the present photosensitive compositions, surfactants for improving their coating properties, e.g., the fluorine-containing surfactants as disclosed in JP-A-62-170950 can be added. The suitable proportion of such a surfactant is in the range of 0.01–1% by weight, particularly 0.05 to 0.5% by weight, to the whole photosensitive composition.

For production of a lithographic printing plate, the present photosensitive compositions each are coated on a dimensionally stable support. Examples of such a support include paper, the paper on which plastic (e.g., polyethylene, propylene, polystyrene) is laminated, a plate of metal such as aluminum (including aluminum alloys), zinc, copper, etc., a film of plastic (e.g., cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate, polyvinyl acetal), and the paper or plastic on which the metal as cited above is laminated. Of these support, an aluminum plate is preferred over the others since it has markedly high dimensional stability and especially high adhesiveness to the photosensitive layers using the present photosensitive compositions, and is inexpensive. Also, a composite sheet formed by laminating an aluminum sheet on a polyethylene terephthalate film, as disclosed in JP-B-48-18327, is preferable.

When a metal support, especially an aluminum plate, is used, it is desirable that the support undergo a surface treatment such as a graining treatment, an anodic oxidation treatment, etc. In order to further enhance the hydrophilic properties of a support surface, the support may be dipped in a water solution of sodium silicate, potassium fluorozirconate, a phosphate or so on. Suitable supports are the aluminum plate which has undergone a graining treatment and then a dipping treatment in a water solution of sodium silicate, as disclosed in U.S. Pat. No. 2,714,066, and the aluminum plate which has undergone an anodic oxidation treatment and then a dipping treatment in a water solution of alkaline metal silicate, as disclosed in JP-B-47-5125. Also, the electrodeposition of a silicate as disclosed in U.S. Pat. No. 3,658,662 is effective. Further, the surface treatment formed by combining the electrolytic graining, as disclosed in JP-B-46-27481, JP-A-52-58602 and JP-A-52-30503, with the above-cited anodic oxidation-sodium silicate treatment is used to advantage. Furthermore, the treatment disclosed in JP-A-56-28893, wherein brush graining, electrolytic graining, anodic oxidation and sodium silicate treatments are carried out in series, is suitable, too.

The aluminum plate is provided with an organic undercoat layer before coating the photosensitive layer thereon, if needed. The organic compound for the organic undercoat layer is chosen, e.g., from among carboxymethyl cellulose, dextrin, gum arabic, amino group-containing phosphonic acids such as 2-aminoethylphosphonic acid, etc., organic phosphonic acids such as optionally substituted phenylphosphonic acid, naphthylphosphonic acid, alkylphosphonic acids, glycerophosphonic acid, methylenediphosphonic acid, ethylenediphosphonic acid, etc., organic phosphates such as optionally substituted phenyl phosphate, naphthyl phosphate, alkyl phosphates, glycerophosphate, etc., organic phosphinic acids such as optionally substituted phenylphosphinic acid, naphthylphosphinic acid, alkylphosphinic acids, glycerophosphinic acid, etc., amino acids such as glycine, β-alanine, etc., and hydroxyl group-containing amine hydrochlorides such as triethanolamine hydrochloride, etc. These compounds may be used as a mixture of two or more thereof.

The organic undercoat layer can be formed in the following manners: One manner involves coating on an aluminum plate a solution of organic compound as cited above in water, an organic solvent, such as methanol, ethanol, methyl ethyl ketone, etc., or a mixture of two or more of the above-cited solvents, and then drying the solution; and another manner involves dipping an aluminum plate in a solution of organic compound as cited above in water, an organic solvent, such as methanol, ethanol, methyl ethyl ketone, etc., or a mixture of two or more of the above-cited solvents to make the organic compound adsorb onto the aluminum plate, washing the aluminum plate with water or the like and then drying. In the former manner, the solution containing the organic compound as cited above in a concentration of 0.005 to 10% by weight can be coated using various methods. For instance, any of a bar coater coating, spin coating, spray coating and curtain coating methods may be adopted. In the latter manner, the concentration of the solution used is in the range of 0.01 to 20% by weight, preferably 0.05 to 5% by weight, the dipping temperature in the range of 20° to 90° C., preferably 25° to 50° C., and the dipping time in the range of 0.1 sec. to 20 min., preferably 2 sec. to 1 min.

As for the solution used therein, it is also possible to adjust the pH thereof within the range of 1 to 12 by the use of a basic material, such as ammonia, triethylamine, potassium hydroxide, etc., and an acidic material, such as hydrochloric acid, phosphoric acid, etc. In addition, yellow dyes can be added to the solution for the purpose of improvement in tone reproduction of the photosensitive lithographic printing plate.

It is desirable that the organic undercoat layer have a dry coverage rate of from 2 to 200 mg/m$^2$, preferably from 5 to 100 mg/m$^2$. When the coverage rate is less than 2 mg/m$^2$, sufficient printing impression cannot be obtained. Even when it is greater than 200 mg/m$^2$, on the other hand, a similar result is produced.

The photosensitive layer surface of the photosensitive lithographic printing plate is preferably rendered matte in order to reduce the evacuating time upon contact exposure with a vacuum flame and prevent a blur from generating upon printing. Specifically, therein can be adopted the method of forming a matte layer as disclosed in JP-A-50-125805, JP-B-57-6582 and JP-B-61-28986, the method of subjecting a solid powder to heat sealable adhesion as disclosed in JP-B-62-62337, and so on.

As for the light source used for imagewise exposure of the photosensitive lithographic printing plate relating to the present invention, a carbon arc lamp, a mercury lamp, xenon lamp, tungsten lamp and metal halide lamp are examples thereof.

The developer suitable for the present photosensitive composition is an alkaline aqueous solution containing substantially no organic solvent (the expression "containing substantially no organic solvent" as used herein means that the concentration of an organic solvent is less than 10% by weight), with specific examples including water solutions of sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium carbonate, sodium bicarbonate, potassium carbonate and potassium bicarbonate, aqueous ammonia and the like. Such solutions have a concentration ranging from 0.1 to 10% by weight, preferably from 0.5 to 5% by weight.

In addition to the above-cited solutions of inorganic alkalis, there can be used aqueous solutions of alkalis, e.g., primary amines such as ethylamine, propylamine, etc., secondary amines such as diethylamine, di-n-butylamine, etc., tertiary amines such as triethylamine, methyldiethylamine, etc., alcoholamines such as dimethylethanolamine, triethanolamine, etc., quaternary ammonium salts such as tetramethylammnonium hydroxide, tetraethylammonium hydroxide, etc., cyclic amines such as pyrrole, piperidine, etc.

Further, alcohols and anionic surfactants can be added in appropriate amounts to the above-cited aqueous solutions of alkalis.

Specific examples of an anionic surfactant which can be added include higher alcohol sulfates containing 8 to 22 carbon atoms, such as sodium lauryl alcohol sulfate, sodium of octyl alcohol sulfate, ammonium lauryl alcohol sulfate, secondary sodium alkylsulfate, etc., aliphatic alcohol phosphates, such as sodium cetyl alcohol phosphate, etc., alkylarylsulfonates, such as sodium dodecylbenzenesulfonate, sodium isopropylnaphthalenesulfonate, sodium m-nitrobenzenesulfonate, etc., alkylamidosulfonates such as $C_{17}H_{33}CON(CH_3)CH_2CH_2SO_3Na$, etc., sulfonates of dibasic fatty acid esters, such as sodium dioctyl sulfosuccinate, sodium dihexyl sulfosuccinate, etc.

It is appropriate to add such an anionic surfactant in a proportion of 0.1 to 5% by weight to the total of ingredients in the developer used. When it is used in a proportion lower than 0.1% by weight, the anionic surfactant cannot achieve its effects satisfactorily; while when the proportion is higher than 5% by weight, bad effects are produced, for instance, excessive elution of dyes from image areas (discoloration) is caused and the mechanical strength (e.g., abrasion resistance) of images and chemical strength of images are deteriorated.

Alcohols suitable for the addition to the foregoing aqueous solution are those which can be dissolved in water in a concentration of not more than 10% by weight, preferably not more than 5% by weight. As examples of such alcohols, mention may be made of 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, 3-methylcyclohexanol, and so on.

The appropriate proportion of an alcohol added to the total of ingredients in the developer used is from 1 to 5% by weight. There is a close relation between the amount of an alcohol used and the amount of a surfactant used, and it is desirable that the amount of an anionic surfactant used be increased with an increase in the amount of an alcohol used. This is because if the anionic surfactant is used in a small amount and the alcohol is used in a large amount, the alcohol cannot be dissolved in the developer to fail to ensure satisfactory developability.

The above illustration concerns the embodiments of lithographic printing plates using the present positive-working photosensitive compositions.

On the other hand, the following illustration relates to embodiments of photoresists to which the present positive-working photosensitive compositions are applied.

As the alkali-soluble resin being used in the present invention, there are a novolak resin, an acetone-pyrogallol resin, polyhydroxystyrene, and the derivatives thereof.

In these alkali-soluble resins, a novolak resin is particularly preferred and the novolak resin is obtained by subjecting a definite monomer as the main component to an aldehyde by addition polycondensation in the presence of an acid catalyst.

As the definite monomer, cresols such as phenol, m-cresol, p-cresol, o-cresol, etc.; xylenols such as 2,5-xylenol, 3,5-xylenol, 3,4-xylenol, 2,3-xylenol, etc.; alkylphenols such as m-ethylphenol, p-ethylphenol, o-ethylphenol, p-t-butylphenol, etc.; trialkylphenols such as 2,3,5-trimethylphenol, 2,3,4-trimethylphenol, etc.; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, etc.; bisalkylphenols such as 2-methyl-4-isopropylphenol, etc.; and hydroxyaromatic compounds such as m-chlorophenol, p-chlorophenol, o-chlorophenol, dihydroxybiphenyl, bisphenol A, phenylphenol, resorcinol, naphthol, etc., can be used singly or as a mixture thereof although the monomer being used in the present invention is not limited to these monomers.

As the aldehydes being used for forming the novolak resin, for example, formaldehyde, para-formaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, n-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and the acetal compounds thereof, such as chloroacetaldehyde diethyl acetal, etc., can be used., and in these compounds, formaldehyde is preferably used.

These aldehydes are used singly or as a mixture thereof.

As the acid catalyst for use in the addition polycondensation described above, hydrochloric acid, sulfuric acid, formic acid, acetic acid, oxalic acid, etc., can be used.

Also, the techniques disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, JP-A-4-122938, etc., that is, the novolak resins wherein low-molecular components were removed or reduced can be preferably used.

The weight-average molecular weight of the novolak resin thus obtained is preferably in the range of from 2,000 to 20,000. If the molecular weight is less than 2,000, the film reduction of the unexposed portions after development is large, while the molecular weight is over 20,000, the development speed is reduced. The particular preferred range of the average molecular weight is from 3,000 to 15,000. In this case, the weight-average molecular weight is defined by the polystyrene converted value of a gel permeation chromatography.

Also, the degree of dispersion (the ratio of a weight-average molecular weight Mw to a number-average molecular weight Mn, i.e., Mw/Mn) of a novolak resin is preferably from 1.5 to 7.0, and more preferably from 1.5 to 4.0. If the degree of dispersion is over 7, the effect of this invention that the layer thickness reliance is good is not obtained and of the degree of dispersion is less than 1.5, a high purifying step is required in the case of synthesizing the novolak resin, whereby the synthesis of the novolak resin is lacking in the reality for the practical use and is unsuitable.

In the present invention, the photosensitive material described above is used and, if necessary, the esterified product of the polyhydroxy compound shown below and 1,2-naphthoquinonediazido-5-(and/or -4-)sulfonyl chloride can be used together.

In this case, the ratio of the naphthoquinonediazide ester photosensitive material of the polyhydroxy compound to the photosensitive material of the present invention is preferably from 20/80 to 80/20 (by weight ratio). That is, if the content of the photosensitive material of the present invention is less than 20% by weight based on the total amount of the photosensitive materials in the photoresist composition, the effect of the present invention cannot sufficiently be obtained.

Examples of the polyhydroxy compound are polyhydroxybenzophenones such as 2,3,4-trihydroxybenzophenone, 2,4,4'-trihydroxybenzophenone, trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, etc.; polyhydroxyphenyl alkyl ketones such as 2,3,4-trihydroxyacetophenone, 2,3,4-trihydroxyphenyl pentyl ketone, 2,3,4-trihydroxyphenyl hexyl ketone, etc.; bis[(poly)hydroxyphenyl]alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1, nordihydroguaiaretic acid, etc.; polyhydroxybenzoic acid esters such as propyl 3,4,5-trihydroxybenzoate, phenyl 2,3,4-trihydroxybenzoate, phenyl 3,4,5-trihydroxybenzoate, etc.; bis(polyhydroxybenzoyl)alkanes or bis(polyhydroxybenzoyl)aryls, such as bis(2,3,4-trihydroxybenzoyl)methane, bis(3-acetyl-4,5,6-trihydroxyphenyl)methane, bis(2,3,4trihydroxybenzoyl)benzene, bis(2,4,6-trihydroxybenzoyl)benzene, etc.; alkylene-di-(polyhydroxy benzoates) such as ethylene glycol-di(3,5-dihydroxy benzoate), ethylene glycol-di(3,4,5-trihydroxy benzoate), etc.; polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, 2,3,4,2',3',4'-biphenylhexol, etc.; bis(polyhydroxy) sulfides such as 4,4'-thiobis(1,3-dihydroxy)benzene, etc.; bis(polyhydroxyphenyl) ethers such as 2,2',4,4'-tetrahydroxy diphenyl ether, etc.; bis(polyhydroxyphenyl) sulfoxides such as 2,2',4,4'-tetrahydroxydiphenyl sulfoxide, etc.; bis(polyhydroxyphenyl) sulfones such as 2,2',4,4'-diphenyl sulfone, etc.; polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,-2',3',4'-hexahydroxy-5,5'-diacetyltriphenylmethane, 2,3,4,2',3',4',3",4"-octahydroxy-5,5'-diacetyltriphenylmethane, 2,4,6,2',4',6'-hexahydroxy-5,5'-dipropionyltriphenylmethane, etc.; polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol, 3,3,3',3'-tetramethyl-1,1'-spirobiindane-4,5,6,5',6',7'-hexol, etc.; polyhydroxy phthalides such as 3,3-bis(3,4-dihydroxyphenyl) phthalide, 3,3-bis(2,3,4-trihydroxyphenyl) phthalide, 3',4',5',6'-tetrahydroxyspiro[phthalido-3,9'-xanthene], etc.; flavono dyes such as morin, kersetin, rutin, etc.; the polyhydroxy compounds described in JP-A-4-253058, such as α,α',α"-tris(4-hydroxyphenyl) 1,3,5-triisopropylbenzene, α,α',α"-tris(3,5-dimethyl-4-hydroxyphenyl) 1,3,5-triisopropylbenzene, α,α',α"-tris(3,5-diethyl-4-hydroxyphenyl) 1,3,5-triisopropylbenzene, α,α',α"-(tris(3,5-di-n-propyl-4-hydroxyphenyl) 1,3,5-triisopropylbenzene, α,α',α"-tris(3,5-diisopropyl-4-hydroxyphenyl) 1,3,5-triisopropylbenzene, α,α',α"-tris(3,5-di-n-butyl-4-hydroxyphenyl) 1,3,5-triisopropylbenzene, α,α',α"-tris(3-methyl-4-hydroxyphenyl) 1,3,5-triisopropylbenzene, α,α',α"-tris(3-methoxy-4-hydroxyphenyl) 1,3,5-triisopropylbenzene, α,α',α"-tris(2,4-dihydroxyphenyl) 1,3,5-triisopropylbenzene, 1,3,5-tris(3,5-dimethyl-4hydroxyphenyl)benzene, 1,3,5-tris(5-methyl-2hydroxyphenyl)benzene, 2,4,6-tris(3,5-dimethyl-4hydroxyphenylthiomethyl)mesitylene, 1-[α-methyl-α-(4'-hydroxyphenyl)ethyl]-4-[α,α'-bis(4"-hydroxyphenyl)ethyl]benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α,α-bis(3"-methyl-4"-hydroxyphenyl)ethyl]benzene, 1-[α-methyl-α-(3'-methoxy-4'-hydroxyphenyl)ethyl]-4-[απ,απ-bis(3"-methoxy-4"-hydroxyphenyl)ethyl]benzene, 1-[α-methyl-α-(2',4'-dihydroxyphenyl)ethyl]-4-[απ,απ-bis(4"-hydroxyphenyl)ethyl]benzene, 1-[α-methyl-α-(2',4'-dihydroxyphenyl)ethyl]-3-[α",α'-bis(4"-hydroxyphenyl)ethyl]benzene, etc.; p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3- bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis-(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis-(2'-hydroxy-3'-t-butyl-5'-methylbenzyl)-p-cresol, 2,6-bis-(2',3',4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethyl-phenol, 4,6-bis(4'-hydroxy-3',5'-dimethylbenzyl)-pyrogallol, 4,6-bis-(4'-hydroxy-3',5'-dimethoxybenzyl)-pyrogallol, 2,6-bis-(4'-hydroxy-3',5'-dimethylbenzyl)-1,3,4-trihydroxyphenol, 4,6-bis-(2',4',6'-trihydroxybenzyl)-2,4-dimethylphenol, and 4,6-bis-(2',3',4'-trihydroxybenzyl)-2,5-dimethylphenol.

Also, the low nuclide of a phenol resin, such as a novolak resin, etc., can be used.

There is given explanation of low molecular weight compounds containing phenolic hydroxyl groups (water-insoluble, alkali-soluble low molecular weight compounds) which can be used in the present invention.

For the purpose of further promoting the dissolution in a developer, it is desirable that the present composition contain a water-insoluble, alkali-soluble low molecular weight compound. By using such a compound, improvement in development latitude can be accomplished.

As for the water-insoluble, alkali-soluble low molecular weight compounds, polyhydroxy compounds are specific examples thereof. Suitable examples of polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensation resin, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4'-(α-methylbenzylidene)bisphenol, α,α',α''-tris(4-hydroxyphenyl)-1,3,5-trisisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, para[α,α,α',α'-tetrakis(4-hydroxyphenyl)]-xylene and so on.

Of these compounds, those containing not more than 60 carbon atoms and from 2 to 8 phenolic hydroxy groups in a molecule are preferred as the water-insoluble, alkali-soluble low molecular weight compound.

More preferably, the water-insoluble, alkali-soluble low molecular weight compound is one or more of a compound in which the ratio of the number of phenolic hydroxy groups to that of aromatic rings ranges from 0.5 to 1.4, the total number of carbon atoms in a molecule is in the range of 12 to 50 and the number of phenolic hydroxy groups in a molecule is in the range of 2 to 10. The compounds favored in particular are those which can increase the speed of dissolving in an alkali a water-insoluble, alkali-soluble resin when they are added to the alkali-soluble resin. By the addition of such compounds, the development latitude can be further improved.

Those compounds lessen the effect of the present invention when the number of carbons contained therein is greater than 60, while they are responsible for a drawback of lowering the heat resistance when the number of carbons contained therein is smaller than 12. In order to achieve the effect of the present invention, it is required of such compounds to contain at least two hydroxyl groups in a molecule. However, those compounds lose their effect of improving the development latitude when they contain more than 10 hydroxyl groups in a molecule. When the ratio of the number of phenolic hydroxyl groups to that of aromatic rings is less than 0.5, the addition of such compounds has a tendency to increase the dependence upon film thickness and narrow the development latitude. When the foregoing ratio is greater than 1.4, on the other hand, the resulting composition suffers deterioration in stability to encounter difficulty in acquiring high resolution and desirable dependence upon film-thickness.

The proportion of such a low molecular weight compound to the alkali-soluble resin is preferably from 1 to 100% by weight, and more preferably from 2 to 90% by weight. When the proportion is increased beyond 100% by weight, the development residue is aggravated, and an additional drawback of deforming patterns is caused upon development.

The aromatic hydroxyl groups-containing, water-insoluble, alkali-soluble low molecular weight compounds used in the present invention can be easily synthesized by those skilled in the arts with reference to the methods described, e.g., in JP-A-4-122938, JP-A-2-28531, U.S. Pat. No. 4,916,210 and European Patent No. 219294.

As the solvent for dissolving the photosensitive material and the alkali-soluble resin in the present invention, there are ethylene glycol monomethyl ether, ethylene glycol monoethyl ether, methylcellosolve acetate, ethylcellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, etc.

The solvents can be used singly or as a combination of them.

Furthermore, the foregoing solvent can be used together with a high-boiling organic solvent such as N-methylformamide, N,N-dimethylformamide, N-methylacetamide, N,N-dimethylacetamide, N-methylpyrrolidone, dimethyl sulfoxide, benzyl ethyl ether, etc.

The positive photoresist composition of the present invention can further contain a surface active agent for improving the coating property such as a striation, etc.

As the surface active agent, there are, for example, nonionic surface active agents such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylallyl ethers (e.g., polyoxyethylene octylphenol ether, and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate), etc.; fluorine series surface active agents such as Eftop EF301, EF303, and EF352 (trade names, made by Sin Akita Kasei K. K.), Megafac F171 and F173 (trade names, made by Dainippon Ink and Chemicals, Inc.), Florad FC430 and FC431 (trade names, made by Sumitomo 3M Limited), Asahiguard AG710, Surflon S-382, SC101, SC102, SC103, SC104, SC105, and SC106 (trade names, made by Asahi Glass Co., Ltd.) etc.; and an organosiloxane polymer KP341 (trade name, made by Shin-Etsu Chemical Co., Ltd.); and acrylic acid series or methacrylic acid series copolymers, Polyflow No. 75 and No. 95 (trade names, made by Kyoei sha Yushi Kagaku Kogyo K. K.).

The compounding amount of the surface active agent is usually not more than 2 parts by weight, and preferably not more than 1 part by weight per 100 parts by weight of the alkali-soluble resin and the quinonediazide compound in the photoresist composition of the present invention.

These surface active agents can be added singly as a combination of them.

As the developer for the positive photoresist composition of the present invention, an aqueous solution of an alkali such as inorganic alkalis (e.g., sodium hydroxide, potassium hydroxide, sodium carbonate, sodium silicate, sodium metasilicate, and aqueous ammonia), primary amines (e.g., ethylamine and n-propylamine), secondary amines (e.g., diethylamine and di-n-butylamine), tertiary amines (e.g., triethylamine and methyldiethylamine), alcoholamines (e.g., dimethylethanolamine and triethanolamine), quaternary ammonium salts (e.g., tetramethylammonium hydroxide, tetraethylammonium hydroxide, and choline), and cyclic amines (e.g., pyrrole and piperidine).

Furthermore, the aqueous alkali solution described above can contain a proper amount of an alcohol such as isopropyl alcohol, etc., or a surface active agent such as a nonionic surface active agent.

The positive photoresist composition of the present invention can, if necessary, contain a light absorber, a crosslinking agent, an adhesion aid, etc.

The light absorber is added, if necessary, to the photoresist composition for the purposes of inhibiting the halation from the substrate and increasing the visualization in the case of coating the photoresist composition on a transparent substrate. As the light absorber, the commercially available light absorbers described, e.g., in *Kogyo yo Shikiso no Gijutu to Shijo (Techniques and Markets of Industrial Dyes)*, published by CMC and *Senryo Binran (Dye Handbook)*, edited by Yuuki Gosei Kagaku Kyokai, such as, for example, C.I. Disperse Yellow 1, 3, 4, 5, 7, 8, 13, 23, 31, 49, 50, 51, 54, 56, 60, 64, 66, 68, 79, 82, 88, 90, 93, 102, 114, and 124; C. I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Yellow 14, 16, 33, and 56; C. I. Solvent Orange 2 and 45; C. I. Solvent Red 1, 3, 8, 23, 24, 25, 27, and 49; C. I. Pigment Green 10; and C. I. Pigment Brown 2 can be suitably used.

The light absorber is compounded in an amount of usually not more than 100 parts by weight, preferably not more than 50 parts by weight, and more preferably not more than 30 parts by weight per 100 parts by weight of the alkali-soluble resin.

The crosslinking agent is added in the range of giving no influences on the formation of positive images. The purposes of the addition of the crosslinking agent are mainly for the improvement of the sensitivity control and the heat resistance, the improvement of the dry etching resistance, etc.

As examples of the crosslinking agent, there are the compounds obtained by acting formaldehyde to melamine, benzoguanamine, glycoluril, etc., the alkyl-denatured products of the foregoing compounds, epoxy compounds, aldehydes, azido compounds, organic peroxides, hexamethylenetetramine, etc.

The crosslinking agent is added in an amount of less than 10 parts by weight, and preferably less than 5 parts by weight to 100 parts by weight of the photosensitive material in the photoresist composition. If the amount of the crosslinking agent is over 10 parts by weight, the sensitivity is lowered and scum (the resist residue) forms, which are undesirable.

The adhesion aid is added for the purpose of improving the adhesion of the resist and the substrate, and particularly for preventing the resist from releasing in the etching step.

Specific examples of the adhesion aid are chlorosilanes such as trimethylchlorosilane, dimethylvinylchlorosilane, methyldiphenylchlorosilane, chloromethyldimethylchlorosilane, etc.; alkoxysilanes such as trimethylmethoxysilane, dimethyldiethoxysilane, methyldimethoxysilane, dimethylvinylethoxysilane, diphenyldimethoxysilane, phenyltriethoxysilane, etc.; silazanes such as hexamethylsilazane, N,N'-bis(trimethylsilyl)urea, dimethyltrimethylsilylamine, trimethylsilylimidazole, etc.; silanes such as vinyltrichlorosilane, γ-chloropropyltrimethoxysilane, γ-aminopropyltriethoxysilane, γ-glycidoxypropyltrimethoxysilane, etc.; heterocyclic compounds such as benzotriazole, benzimidazole, indazole, imidazole, 2-mercaptobenzimidazole, 2-mercaptobenzothiazole, 2-mercaptobenzoxazole, urazole, thiourasil, mercaptoimidazole, mercaptopyrimidine, etc.; ureas such as 1,1-dimethylurea, 1,3-dimethylurea, etc., and thiourea compounds.

The adhesion aid is compounded in the amount of usually less than 10 parts by weight, and preferably less than 5 parts by weight per 100 parts by weight of the alkali-soluble resin.

A good resist can be obtained by coating the positive photoresist composition of the present invention described above on a substrate being used for the production of a precise integrated circuit element (e.g., a transparent substrate such as a silicon substrate coated with silicon oxide, a glass substrate, an ITO substrate, etc.) by a proper coating method such as spin coating, roll coating, flow coating, dip coating, spray coating, doctor coating, etc., followed by baking, light-exposing through a definite mask, if necessary, heating (PEB: pose exposure baking), developing, rinsing, and drying.

The synthesis examples and the examples according to the present invention are illustrated below, but the invention should not be construed as being limited to these examples.

SYNTHESIS EXAMPLE 1

Synthesis of Exemplified Compound 1:

In a three necked flask, 58.2 g of Compound of formula (A) illustrated below, 53.7 g of 1,2-naphthoquinonediazido-5-sulfonylchloride and 800 ml of acetone were placed to prepare a homogeneous solution. Thereinto was gradually dripped 42.4 g of triethylamine, and the reaction was run for 3 hours at 25° C. The reaction mixture was poured into 2,500 ml of a 1% water solution of hydrochloric acid, and a precipitate generated was filtered off, washed with water and dried (40° C.). Thus, 93.5 g of Exemplified Compound 1 was obtained.

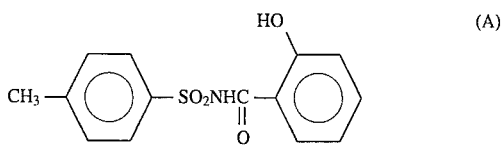

SYNTHESIS EXAMPLE 2

Synthesis of Exemplified Compound 9:

In a three necked flask, 43.9 g of Compound of formula (B) illustrated below, 53.7 g of 1,2-naphthoquinonediazido-5-sulfonylchloride and 1,000 ml of acetone were placed to prepare a homogeneous solution. Thereinto was gradually dripped 31.3 g of triethylamine, and the reaction was run for 3 hours at 25° C. The reaction mixture was poured into 3,500 ml of a 1% water solution of hydrochloric acid, and a precipitate generated was filtered off, washed with water and dried (40° C.). Thus, 86.2 g of 1,2-naphthoquinonediazido-5-sulfonic acid esters of Compound (B) was obtained.

The thus obtained product was subjected to high-speed liquid chromatography and the elution curve was measured by means of a detector using UV light of 254 nm. As a result of it, it turned out that 80% of the whole pattern area was ascribed to the diester of Compound (B) (Exemplified Compound 9) and 8% of the whole pattern area to the monoester of Compound (B).

Additionally, the measurement of an elution curve in high-speed liquid chromatography was made using a chromatographic apparatus, LC-6A, made by Shimadzu Corporation, wherein a Nova-PakC$_{18}$ (4 μm) column of 8 mmΦx 100 mm was used and a solution composed of 68.4% of water, 30.0% of acetonitrile, 0.7% of triethylamine and 0.7% of phosphoric acid was made to flow as a carrier solvent through the column at a flow rate of 2.0 ml/min.

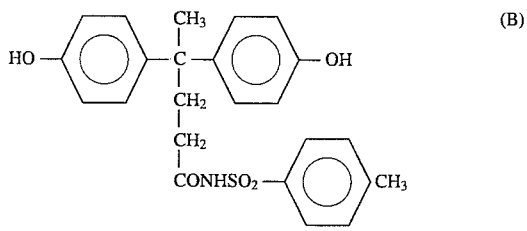

SYNTHESIS EXAMPLE 3

Synthesis of Exemplified Compound 23:

In a three necked flask, 27.9 g of Compound of formula (C) illustrated below, 53.7 g of 1,2-naphthoquinonediazido-5-sulfonylchloride and 800 ml of acetone were placed to prepare a homogeneous solution. Thereinto was gradually dripped 31.2 g of triethylamine, and the reaction was run for 3 hours at 25° C. The reaction mixture was poured into 2,500 ml of a 1% water solution of hydrochloric acid, and a precipitate generated was filtered off, washed with water and dried (40° C.). Thus, 78.8 g of 1,2-naphthoquinonediazido-5-sulfonic acid esters of Compound (C) was obtained.

The thus obtained product was subjected to high-speed liquid chromatography and the elution curve was measured by means of a detector using UV light of 254 nm. As a result of it, it turned out that 95% of the whole pattern area was ascribed to the diester of Compound (C) (Exemplified Compound 23).

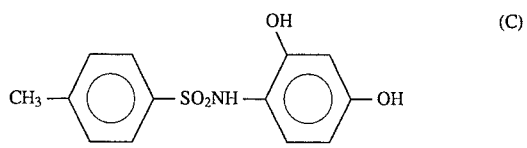

SYNTHESIS EXAMPLE 4

Synthesis of Exemplified Compound 7:

In a three necked flask, 30.9 g of Compound of formula (D) illustrated below, 80.6 g of 1,2-naphthoquinonediazido-5-sulfonylchloride and 800 ml of acetone were placed to prepare a homogeneous solution. Thereinto was gradually dripped 31.9 g of triethylamine, and the reaction was run for 3 hours at 25° C. The reaction mixture was poured into 2,500 ml of a 1% water solution of hydrochloric acid, and a precipitate generated was filtered off, washed with water and dried (40° C.). Thus, 95.6 g of Exemplified Compound 7 was obtained.

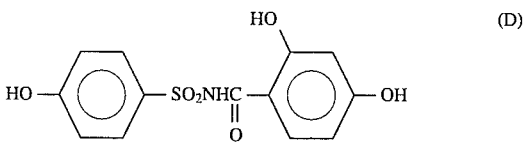

SYNTHESIS EXAMPLE 5

Synthesis of Exemplified Compound 10:

In a three necked flask, 52.8 g of Compound of formula (E) illustrated below, 53.7 g of 1,2-naphthoquinonediazido-5-sulfonylchloride and 800 ml of acetone were placed to prepare a homogeneous solution. Thereinto was gradually dripped 21.2 g of triethylamine, and the reaction was run for 3 hours at 25° C. The reaction mixture was poured into 2,500 ml of a 1% water solution of hydrochloric acid, and a precipitate generated was filtered off, washed with water and dried (40° C.). Thus, 94.2 g of 1,2-naphthoquinonediazido-5-sulfonic acid esters of Compound (E) was obtained.

The thus obtained product was subjected to high-speed liquid chromatography and the elution curve was measured by means of a detector using UV light of 254 nm. As a result of it, it turned out that 85% of the whole pattern area was ascribed to the diester of Compound (E) (Exemplified Compound 10).

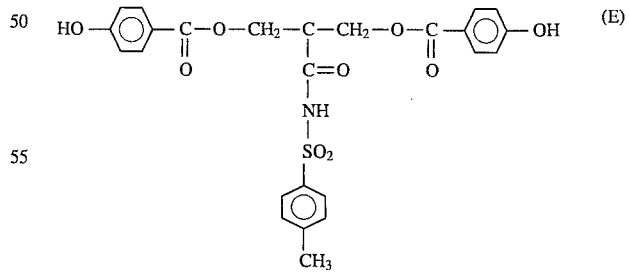

SYNTHESIS EXAMPLE 6

Synthesis of Exemplified Compound 11:

In a three necked flask, 56.0 g of Compound of formula (F) illustrated below, 107.5 g of 1,2-naphthoquinonediazido-5-sulfonylchloride and 1,200 ml of acetone were placed to prepare a homogeneous solution. Thereinto was gradually dripped 42.5 g of triethylamine, and the reaction was run for 3 hours at 25° C. The reaction mixture was poured into 3,800 ml of a 1% water solution of hydrochloric acid, and a precipitate generated was filtered off, washed with water and dried (40° C.). Thus, 114.0 g of 1,2-naphthoquinonediazido-5-sulfonic acid esters of Compound (F) was obtained.

The thus obtained product was subjected to high-speed liquid chromatography and the elution curve was measured by means of a detector using UV light of 254 nm. As a result of it, it turned out that 82% of the whole pattern area was ascribed to the tetraester of Compound (F) (Exemplified Compound 11).

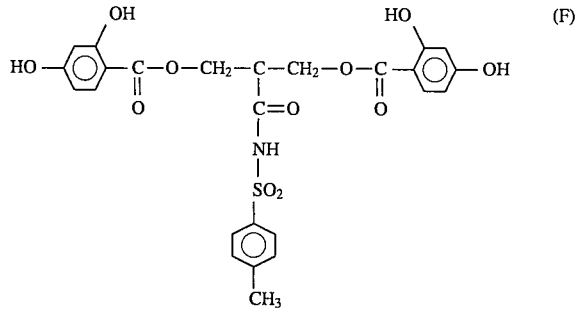

SYNTHESIS EXAMPLE 7

Synthesis of Exemplified Compound 16:

In a three necked flask, 60.1 g of Compound of formula (G) illustrated below, 107.5 g of 1,2-naphthoquinonediazido-5-sulfonylchloride and 1,200 ml of acetone were placed to prepare a homogeneous solution. Thereinto was gradually dripped 42.5 g of triethylamine, and the reaction was run for 3 hours at 25° C. The reaction mixture was poured into 3,800 ml of a 1% water solution of hydrochloric acid, and a precipitate generated was filtered off, washed with water and dried (40° C.). Thus, 137.8 g of 1,2-naphthoquinonediazido-5-sulfonic acid esters of Compound (G) was obtained.

The thus obtained product was subjected to high-speed liquid chromatography and the elution curve was measured by means of a detector using UV light of 254 nm. As a result of it, it turned out that 78% of the whole pattern area was ascribed to the tetraester of Compound (G) (Exemplified Compound 16).

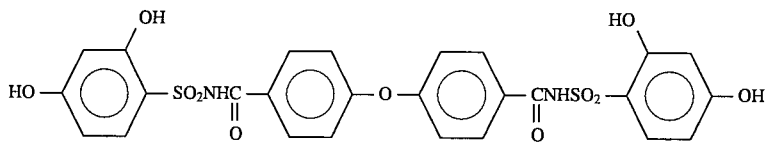

SYNTHESIS EXAMPLE 8

Synthesis of Exemplified Compound 27:

In a three necked flask, 45.2 g of Compound of formula (H) illustrated below, 107.5 g of 1,2-naphthoquinonediazido-5-sulfonylchloride and 1,000 ml of acetone were placed to prepare a homogeneous solution. Thereinto was gradually dripped 42.5 g of triethylamine, and the reaction was run for 3 hours at 25° C. The reaction mixture was poured into 3,200 ml of a 1% water solution of hydrochloric acid, and a precipitate generated was filtered off, washed with water and dried (40° C.). Thus, 124.3 g of 1,2-naphthoquinonediazido-5-sulfonic acid esters of Compound (H) was obtained.

The thus obtained product was subjected to high-speed liquid chromatography and the elution curve was measured by means of a detector using UV light of 254 nm. As a result of it, it turned out that 79% of the whole pattern area was ascribed to the tetraester of Compound (H) (Exemplified Compound 27).

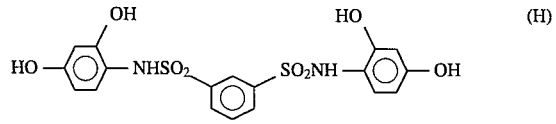

SYNTHESIS EXAMPLE 9

Synthesis of Exemplified Compound 28:

In a three necked flask, 48.3 g of Compound of formula (I) illustrated below, 53.7 g of 1,2-naphthoquinonediazido-5-sulfonylchloride and 800 ml of acetone were placed to prepare a homogeneous solution. Thereinto was gradually dripped 21.2 g of triethylamine, and the reaction was run for 3 hours at 25° C. The reaction mixture was poured into 2,500 ml of a 1% water solution of hydrochloric acid, and a precipitate generated was filtered off, washed with water and dried (40° C.). Thus, 90.0 g of 1,2-naphthoquinonediazido-5-sulfonic acid esters of Compound (I) was obtained.

The thus obtained product was subjected to high-speed liquid chromatography and the elution curve was measured by means of a detector using UV light of 254 nm. As a result of it, it turned out that 89% of the whole pattern area was ascribed to the diester of Compound (I) (Exemplified Compound 28).

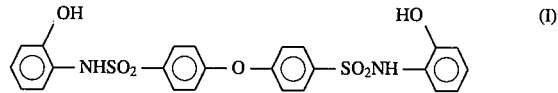

SYNTHESIS EXAMPLE 10

Synthesis of Exemplified Compound 30:

In a three necked flask, 56.1 g of Compound of formula (J) illustrated below, 107.5 g of 1,2-naphthoquinonediazido-5-sulfonylchloride and 1,200 ml of acetone were placed to prepare a homogeneous solution. Thereinto was gradually dripped 42.5 g of triethylamine, and the reaction was run for 3 hours at 25° C. The reaction mixture was poured into 3,800 ml of a 1% water solution of hydrochloric acid, and a precipitate generated was filtered off, washed with water and dried (40° C.). Thus, 134.1 g of 1,2-naphthoquinonediazido-5-sulfonic acid esters of Compound (J) was obtained.

The thus obtained product was subjected to high-speed liquid chromatography and the elution curve was measured by means of a detector using UV light of 254 nm. As a result of it, it turned out that 79% of the whole pattern area was ascribed to the tetraester of Compound (J) (Exemplified Compound 30).

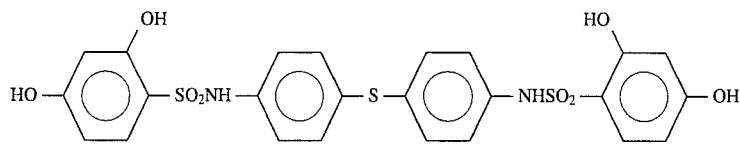
(J)

SYNTHESIS EXAMPLE 11

Synthesis of Comparative Compound 1:

The 1,2-naphthoquinonediazido-5-sulfonic acid triester of Compound of formula (K) illustrated below (Comparative Compound 1) was synthesized using the method described in JP-A-4-274431.

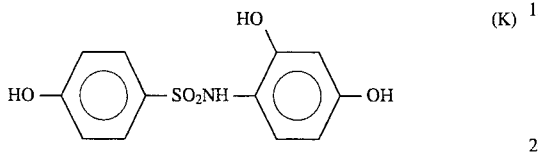
(K)

SYNTHESIS EXAMPLE 12

Synthesis of Comparative Compound 2:

In a three necked flask, 29.7 g of Compound of formula (L) illustrated below, 107.5 g of 1,2-naphthoquinonediazido-5-sulfonylchloride and 1,000 ml of acetone were placed to prepare a homogeneous solution. Thereinto was gradually dripped 42.5 g of triethylamine, and the reaction was run for 3 hours at 25° C. The reaction mixture was poured into 3,200 ml of a 1% water solution of hydrochloric acid, and a precipitate generated was filtered off, washed with water and dried (40° C.). Thus, 110.4 g of 1,2-naphthoquinonediazido-5-sulfonic acid esters of Compound (L) was obtained.

The thus obtained product was subjected to high-speed liquid chromatography and the elution curve was measured by means of a detector using UV light of 254 nm. As a result of it, it turned out that 80% of the whole pattern area was ascribed to the tetraester of Compound (L) (Comparative Compound 2).

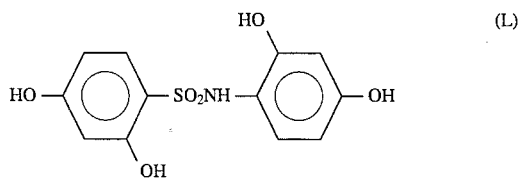
(L)

EXAMPLES 1 TO 4 AND COMPARATIVE EXAMPLES a TO c

The surface of a 0.30 mm-thick aluminum plate was grained with a nylon brush and an aqueous suspension of 400 mesh pumice, and thoroughly rinsed with water. Then, the plate was etched by 60 seconds' dipping in a 10% aqueous NaOH kept at 70° C., and washed with running water. Further, the etched plate was rinsed with a 20% aqueous $HNO_3$ for neutralization, and washed with water. Then, the resulting plate underwent an electrolytic surface-roughening treatment using sine wave alternating current under a potential of 12.7 V in a quantity of electricity of 160 Coulomb/cm$^2$ at the anode in a 1% water solution of nitric acid. Its surface roughness measured was 0.6 μm (expressed in Ra). Subsequently, the plate was dismatted by being soaked in a 30 water solution of sulfuric acid at 55° C. for 2 minutes. Thereafter, the plate was subjected to an anodic oxidation treatment using a 20% water solution of sulfuric acid under a current density of 2 A/dm$^2$, thereby forming an anodically oxidized film of 2.7 g/m$^2$. Thus, a base plate was prepared.

To the thus obtained base plate, the following undercoat solution was applied, and dried at 80° C. for 30 seconds. The dry coverage of the undercoat was 30 mg/m$^2$.

Undercoat Solution A

| | |
|---|---|
| Aminoethylphosphonic acid | 0.1 g |
| Phenylphosphonic acid | 0.15 g |
| β-Alanine | 0.1 g |
| Methanol | 40 g |
| Purified water | 60 g |

The resulting aluminum plate was further coated with the following photosensitive solution (A), and dried at 100° C. for 1 minute to obtain a positive working photosensitive lithographic printing plate. The dry coverage was 1.7 g/m$^2$.

Photosensitive Solution (A)

| | |
|---|---|
| Photosensitive material set forth in Table 1 | 0.43 g |
| Cresol-formaldehyde novolak resin (meta/para ratio = 6/4, mean molecular weight: 1,100, unreacted cresol content: 0.5%) | 1.1 g |
| m-Cresol-formaldehyde resin (weight-average molecular weight: 1,700, number-average molecular weight: 600, unreacted cresol content: 1%) | 0.3 g |
| N-(p-Aminosulfonylphenyl)acrylamide/n-butyl-acrylate/diethylene glycol monomethylether-methacrylate (40:40:20) copolymer | 0.2 g |
| p-n-Octylphenol-formaldehyde resin | 0.02 g |
| Naphthoquinone-1,2-diazido-4-sulfonic acid chloride | 0.01 g |
| Benzoic acid | 0.02 g |
| Tetrahydrophthalic anhydride | 0.05 g |
| 4-(p-N,N-Di(ethoxycarbonyl)aminophenyl)-2,6-bis(trichloromethyl)-s-triazine | 0.02 g |
| 4-(p-N-(p-Hydroxybenzoyl)aminophenyl)-2,6-bis-(trichloromethyl)-s-triazine | 0.02 g |
| 2-Trichloromethyl-5-(4-hydroxystyryl)-1,3,4-oxadiazole | 0.01 g |
| Victoria Pure Blue BOH containing 1-naphthalene-sulfonate ion as a counter ion | 0.01 g |
| Ethyl Violet containing 6-hydroxynaphthalene-sulfonate ion as a counter ion | 0.01 g |
| Megafac F-176 (fluorine-containing surfactant, produced by Dai-Nippon Ink & Chemicals, Inc.) | 0.06 g |
| Methyl ethyl ketone | 25 g |

The photosensitive lithographic printing plate thus obtained was set in a vacuum printing frame, and exposed for seconds to a halide lamp through Fuji Step Guide (a product of Fuji Photo Film Co., Ltd., namely a step tablet having 15 steps wherein the density of transmitted light is 0.05 at the first step and it increases by 0.15 every one step,). Then, the exposed plate was processed with an automatic developing machine provided with a developer produced by Fuji Photo Film Co., Ltd., 1/8 DP-4 (or a developer prepared by diluting 1 part by volume of DP-4 with 8 parts by volume of water) and a rinsing solution produced by Fuji Photo Film Co., Ltd., 1/7 FR-3 (or a solution prepared by diluting 1 part by volume of FR-3 with 7 parts by volume of water).

The temperature of the developer under the above-described development condition was 25° C. In addition, the development was performed under another condition, that is, under a temperature raised up to 40° C., and the developed plate was examined by visual observation as to whether or not the image area of the photosensitive layer was eluted.

The results obtained are shown in Table 2.

As can be seen from Table 2, the positive working photosensitive lithographic printing plates according to the present invention had satisfactory sensitivity and a great development latitude, compared with the comparative ones.

TABLE 1

| | Photosensitive Material |
|---|---|
| Example 1 | Compound obtained in Synthesis Example 1 |
| Example 2 | Compound obtained in Synthesis Example 2 |
| Example 3 | Compound obtained in Synthesis Example 6 |
| Example 4 | Compound obtained in Synthesis Example 3 |
| Comparative Example a | Esterification product of pyrogallol-acetone resin and 1,2-diazonaphthoquinone-5-sulfonyl chloride (as described in Example 1 of U.S. Pat. No. 3,635,709) |
| Comparative Example b | Esterification product of phenol-formaldehyde resin and 1,2-diazonaphthoquinone-5-sulfonyl chloride (as described in Example 1 of U.S. Pat. No. 3,046,120) |
| Comparative Example c | Esterification product of 2,2,4,4'-tetrahydroxybenzophenone and 1,2-diazonaphthoquinone-5-sulfonyl chloride (esterification degree: 77%) |
| Comparative Example d | Comparative Compound 1 |

TABLE 2

| | Mininum Number of Step enabling Photosensitive Layer to remain as Image | Decrease in Photosensitive Layer Thickness upon 40° C. Development (visual observation) |
|---|---|---|
| Example 1 | 5 | slight |
| Example 2 | 6 | slight |
| Example 3 | 5 | nil |
| Example 4 | 5 | slight |
| Comparative Example a | 4 | about one-half |
| Comparative Example b | 3 | great |
| Comparative Example c | 3 | about one-half |
| Comparative Example d | 4 | slight |

EXAMPLE 5 AND COMPARATIVE EXAMPLE e

The surface of a 0.30 mm-thick aluminum plate was grained with a nylon brush and an aqueous suspension of 400 mesh pumice, and thoroughly rinsed with water. Then, the plate was etched by 60 seconds' dipping in a 10% aqueous NaOH kept at 70° C., and washed with running water. Further, the etched plate was rinsed with a 20% aqueous $HNO_2$ for neutralization, and washed with water. Then, the resulting plate underwent an electrolytic surface-roughening treatment using sine wave alternating current under the condition of $V_A=12.7$ V in a quantity of electricity of 160 Coulomb/cm² at the anode in a 1% water solution of nitric acid. Its surface roughness measured was 0.6 μm (expressed in Ra). Subsequently, the plate was dismatted by being soaked in a 30 water solution of $H_2SO_4$ at 55° C. for 2 minutes. Thereafter, the plate was subjected to an anodic oxidation treatment using a 20% water solution of $H_2SO_4$ under a current density of 2 A/dm², thereby forming an anodically oxidized film of 2.7 g/m². Then, the plate was dipped for 1 minute in a 2.5% water solution of sodium silicate at 70° C., washed with water and dried. To the thus processed aluminum plate, a undercoat solution (B) having the following composition was applied, and dried at 80° C. for 30 seconds. The dry coverage of the undercoat was 30 mg/m².

Undercoat Solution B

| Phenylphosphonic acid | 0.10 g |
|---|---|
| Methanol | 40 g |
| Purified water | 60 g |

Thus, a base plate was prepared.

The base plate obtained was coated with the following photosensitive solution (B) at a coverage rate of 25 ml/m² by a rod coating method, and dried at 100° C. for 1 minute to obtain a positive working photosensitive lithographic printing plate. The dry coverage was about 1.7 g/m².

Photosensitive Solution (B)

| Photosensitive material set forth in Table 3 | 0.75 g |
|---|---|
| Polymer (C) illustrated below | 2.0 g |
| 2-(p-Butoxyphenyl)-4,6-bis(trichloromethyl)-s-triazine | 0.02 g |
| Naphthoquinone-1,2-diazido-4-sulfonic acid chloride | 0.03 g |
| Crystal Violet | 0.01 g |
| Oil Blue #603 (product of Orient Kagaku Kogyo K.K.) | 0.015 g |
| Ethylene dichloride | 18 g |
| 2-Methoxyethylacetate | 12 g |

Each of the thus obtained photosensitive lithographic printing plates was exposed for 40 seconds to a 2 kW metal halide lamp placed at a distance of 1 m via Fuji Step Guide.

Then, the exposed plate was processed under the following condition: An automatic developing machine, Stablon 900 NP, made by Fuji Photo Film Co., Ltd., was provided with a developer (pH 10) obtained by diluting an undiluted developer-1 described below with 4 times as much water as the developer and a finisher, FP-2, a product of Fuji Photo Film Co., Ltd., and the development was carried out for 30 seconds under the developer temperature of 30° C.

Undiluted Developer-1

| Sodium carbonate monohydrate | 6 g |
|---|---|
| Sodium hydrogen carbonate | 3 g |
| Ethylenediaminetetraacetic acid | 2 g |
| Sodium dodecylbenzenesulfonate | 1 g |
| Water | 100 g |

After the development processing, the remaining images were examined for the corresponding step number. Further, in order to examine as to whether the range of appropriate development condition (development latitude) was wide or not, another development processing was performed changing the dipping time in the developer to 5 minutes, thereby examining a change in gradation reproducibility. As for the examination results, the case in which almost no change in reproduction of gradation was observed was indicated by A, the case in which a great change in reproduction of gradation was observed was indicated by C, and the case situated between the above two cases was indicated by B.

The results obtained are shown in Table 4.

TABLE 3

| Photosensitive Material | |
| --- | --- |
| Example 5 | Exemplified Compound 8 |
| Comparative Example e | Esterification product of 1,2-naphthoquinone-diazido-5-sulfonyl chloride and 2,3,4-trihydroxybenzophenone |

Polymer (C)

$$\mathrm{+CH_2\underset{\underset{\underset{SO_2-\langle\bigcirc\rangle-CH_3}{|}}{\underset{NH}{|}}}{\underset{C=O}{|}}C+_{28}-(CH_2CH)_{21}-(CH_2CH)_{51}-}$$
           CN           $C=O$
                        $OC_2H_5$

TABLE 4

| | Minimum Number of Step enabling Photosensitive Layer to remain as Image | Development Latitude |
| --- | --- | --- |
| Example 5 | 5 | A |
| Comparative Example e | 4 | B |

EXAMPLES 6 TO 19 AND COMPARATIVE EXAMPLES f AND q

The novolak resins (A) and (B) obtained in Synthesis Examples described below, the photosensitive materials obtained in Synthesis Examples or set forth as Exemplified Compounds and, if needed, the low molecular weight compounds were mixed in combinations and in amounts as shown in Table 5. Each of the combinations was dissolved in 18 g of ethyl lactate and 4.5 g of ethoxyethyl propionate, and filtered with a 0.1 μm microfilter to prepare a photoresist composition. Each photoresist composition was coated on a silicon wafer by means of a spinner, and dried at 90° C. for 60 seconds with a hot plate of vacuum adsorption type to form a resist film having a thickness of 0.98 μm. Each of the thus formed resist films was exposed by means of a reduced projection exposure apparatus (NSR-2005i9C, made by Nicon Ltd.), heated at 120° C. for 60 seconds by means of a hot plate of vacuum adsorption type, developed for 1 minute with a 2.38% water solution of tetramethylammonium hydroxide, washed with water for 30 seconds, and then dried.

Synthesis of Novolak Resin (A):

In a three necked flask which had an inner volume of 500 ml and was equipped with a stirrer and a condenser, 58.5 g of m-cresol, 4.92 g of 2,6-bis(hydroxymethyl)-4-methylphenol, 49.3 g of 2,3-xylenol and 48.5 g of formaldehyde (37% aqueous solution) were placed, and thoroughly stirred under heating with an 109° C. oil bath. Thereto, 0.15 g of oxalic acid was added, followed by 15 hours' heating with stirring.

Then, the temperature of the reaction solution was raised up to 205° C., and the pressure inside the flask was gradually reduced to 1–2 mmHg. Under this condition, the distillation was carried out for 2 hours, thereby removing unreacted monomer, water, formaldehyde, oxalic acid and so on. The temperature of the reaction system was lowered to room temperature, thereby yielding 73 g of a novolak resin.

A 20 g portion of this novolak resin was dissolved in 65 g methanol. Thereto, 30 g of distilled water was slowly added with stirring to precipitate a resin component. The upper layer of the thus separated two layers was removed by decantation. The residue was admixed with 30 g of methanol and dissolved therein, and 40 g of distilled water was slowly added thereto again with stirring to precipitate the resin component. The upper layer separated was removed by decantation, and the recovered resin component was dried at 40° C. for 24 hours with a vacuum oven. Thus, 9.2 g of novolak resin (A) was obtained. The weight-average molecular weight $M_w$ was found to be 8570 by GPC analysis.

Synthesis of Novolak Resin (B):

A mixture of 6.5 g of methylenebis-p-cresol, 2.2 g of o-cresol, 79.7 g of dimethylphenol, 26.2 g of 2,3,5-trimethylphenol, 2,6-dimethylphenol and 51 g of diethylene glycol monomethyl ether was put in a three necked flask equipped with a stirrer, a reflux condenser and a thermometer. Thereto, 84 g of 37% aqueous solution of formaldehyde was added, and stirred under heating with a 110° C. oil bath. At the time the temperature inside the flask went up to 90° C., 6.1 g of oxalic acid dihydrate was added. Thereafter, the reaction was continued for 18 hours as the temperature of the oil bath was kept at 128° C., and then the reflux condenser was detached, followed by the removal of unreacted monomer through vacuum distillation at 200° C. The thus obtained novolak resin (B) was found to have $M_w$ of 3640.

The thus formed resist patterns on the silicon wafers were observed under a scanning electron microscope for the evaluation of the photoresist compositions used. The evaluation results are shown in Table 6.

The sensitivity was defined in terms of the exposure amount required for reproducing the 0.4 μm mask pattern.

In order to evaluate the development latitude, the resist patterns were formed in the same manner as above, except that the development time was changed to 40 seconds and to 90 seconds, respectively. The ratio between the above-defined sensitivities attained under these two different development conditions is given as an indication of development stability. Accordingly, when the above-defined ratio is closer to 1.0, the more desirable result, that is, the higher development stability is obtained.

The resolution is expressed in terms of the threshold resolving power determined under the exposure to reproduce the 0.4 μm mask pattern.

As for the heat resistance, each resist pattern formed on silicon wafer is examined for temperature under which no deformation is caused in the pattern even when the pattern is heated for 4 minutes with a hot plate kept at that temperature, and the heat resistance is expressed as that temperature.

TABLE 5

Formula of Positive Working Photoresist Composition

| Example No. | Water-Insoluble Alkali-Soluble Resin | | Water-Insoluble Alkali-Soluble Low Molecular Weight Compound | | Radiation Responsive Compound | | | |
|---|---|---|---|---|---|---|---|---|
| | Species | Amount | Species | Amount | I | Amount | II | Amount |
| 6 | Novolak Resin (B) | 4.37 g | P-1 | 0.96 g | Exemplified Compound 7 | 2.18 g | | — |
| 7 | Novolak Resin (B) | " | " | " | Exemplified Compound 10 | 2.18 g | | — |
| 8 | Novolak Resin (B) | " | " | " | Exemplified Compound 11 | 2.18 g | | — |
| 9 | Novolak Resin (B) | " | " | " | Exemplified Compound 16 | 2.18 g | | — |
| 10 | Novolak Resin (B) | " | " | " | Exemplified Compound 29 | 2.18 g | | — |
| 11 | Novolak Resin (B) | " | " | " | Exemplified Compound 30 | 2.18 g | | — |
| 12 | Novolak Resin (B) | 4.61 g | " | 1.013 g | Exemplified Compound 27 | 0.938 g | S-2 | 0.938 g |
| 13 | Novolak Resin (B) | 4.37 g | " | 0.96 g | Exemplified Compound 28 | 0.655 g | S-1 | 1.523 g |
| 14 | Novolak Resin (B) | " | P-2 | " | Exemplified Compound 30 | 2.18 g | | — |
| 15 | Novolak Resin (B) | 4.37 g | P-3 | 0.96 g | Exemplified Compound 30 | 2.18 g | | — |
| 16 | Novolak Resin (B) | " | P-4 | " | Exemplified Compound 30 | 2.18 g | | — |
| 17 | Novolak Resin (A) | 3.62 g | P-1 | 1.208 g | Exemplified Compound 10 | 0.682 g | S-1 | 1.59 g |
| 18 | Novolak Resin (A) | " | (P-1)/(P-5) | 0.846/0.362 | Exemplified Compound 11 | 0.909 g | S-1 | 1.364 g |
| 19 | Novolak Resins (A/B) | 2.54/1.09 | P-1 | 1.208 | Exemplified Compound 11 | 0.909 g | S-1 | 1.364 g |
| Comparative Example f | Novolak Resin (B) | 4.37 g | P-1 | 0.96 g | Comparative Example 1 | 2.18 g | | — |
| Comparative Example g | Novolak Resin (B) | 4.37 g | P-1 | 0.96 g | Comparative Example 2 | 2.18 g | | — |
| Comparative Example h | Novolak Resin (B) | 4.37 g | P-1 | 0.96 g | S-3 | 21.8 g | | — |

The compounds set forth in Table 5 are as follows;

P-1: 1-[α-Methyl-α-(4'-hydroxyphenyl)]-4-[απ,απ-bis(4"-hydroxyphenyl)ethyl]benzene P-2: Tris(4-hydroxyphenyl)methane P-3: 1,1-Bis(4-hydroxyphenyl)cyclohexane P-4: Bis(2,5-dimethyl-4-hydroxyphenyl)-2'-hydroxyphenylmethane P-5: 2,6-Bis(2'-hydroxy-5'-methylbenzyl) 4-methylphenol S-1: Esterification product obtained from the reaction of 1,2-naphthoquinonediazido-5-sulfonic acid chloride (2 moles) with 1,1-bis{3-(4'-hydroxybenzyl)-4-hydroxy-5-methylphenyl}cyclohexane (1 mole)

S-2: Esterification product obtained from the reaction of 1,2-naphthoquinonediazido-5-sulfonic acid chloride (2 moles) with 2,6-bis(4'-hydroxybenzyl)-4-cyclohexylphenol (1 mole)

S-3: Esterification product obtained from the reaction of 1,2-naphthoquinonediazido-5-sulfonic acid chloride (4 moles) with 2,3,4,4'-tetrahydroxybenzophenone (1 mole)

TABLE 6

| | Evaluation Results | | | |
|---|---|---|---|---|
| Example No. | Sensitivity mJ/cm$^2$ | Development Stability | Resolution (μm) | Heat Resistance |
| 6 | 190 | 0.90 | 0.31 | 130 |
| 7 | 225 | 0.90 | 0.31 | 125 |
| 8 | 240 | 0.92 | 0.30 | 130 |
| 9 | 185 | 0.91 | 0.31 | 130 |
| 10 | 190 | 0.92 | 0.31 | 135 |
| 11 | 195 | 0.89 | 0.30 | 135 |
| 12 | 180 | 0.89 | 0.31 | 125 |
| 13 | 175 | 0.87 | 0.32 | 125 |
| 14 | 180 | 0.88 | 0.31 | 135 |
| 15 | 195 | 0.90 | 0.31 | 125 |
| 16 | 205 | 0.92 | 0.30 | 130 |
| 17 | 225 | 0.92 | 0.31 | 125 |
| 18 | 200 | 0.91 | 0.31 | 130 |
| 19 | 210 | 0.90 | 0.32 | 125 |
| Comparative Example | | | | |

TABLE 6-continued

| | Evaluation Results | | | |
|---|---|---|---|---|
| | Sensitivity mJ/cm$^2$ | Development Stability | Resolution (μm) | Heat Resistance |
| f | 225 | 0.72 | 0.35 | 120 |
| g | 260 | 0.78 | 0.34 | 120 |
| h | 270 | 0.68 | 0.34 | 115 |

As can be seen from Table 6, the resist samples satisfying the requirements of the present invention achieved high sensitivity, high resolution and high heat resistance and were well balanced among other resist properties, compared with comparative resist samples.

By the use of the positive working photosensitive compositions according to the present invention, there can be obtained (1) photosensitive lithographic printing plates having high sensitivity and great development latitude, and (2) positive photoresist compositions for superfine processing which have high sensitivity and high resolution.

While the invention has been described in detail and with reference to specific embodiments thereof, it will be apparent to one skilled in the art that various changes and modifications can be made therein without departing from the spirit and scope thereof.

What is claimed is:

1. A positive working photosensitive composition, comprising a quinonediazide ester compound represented by the following general formula (I):

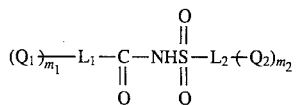

wherein $L_1$ and $L_2$ each represent an unsubstituted or substituted polyvalent linkage group which consists of non-metallic atoms; $Q_1$ and $Q_2$ each represent a hydrogen atom or a quinonediazide structure; $m_1$ and $m_2$ each represent an integer from 1 to 15; provided that at least one $Q_1$ or $Q_2$ group represents a quinonediazide structure.

2. A positive working photosensitive composition as in claim 1, wherein the quinonediazide structure is 1,2-naphthoquinonediazide or 2,1-naphthoquinonediazide structure.

3. A positive working photosensitive composition as in claim 1, wherein the number of quinonediazide structures present in a molecule is in the range of 1 to 15.

4. A positive working photosensitive composition as in claim 1, wherein the number of quinonediazide structures present in a molecule is in the range of 1 to 10.

5. A positive working photosensitive composition as in claim 1, wherein the number of N-sulfonylamide structural units present in a molecule of general formula (I) is in the range of 1 to 10.

6. A positive working photosensitive composition as in claim 1, wherein the proportion of the quinonediazide structures to the N-sulfonylamide structural units is in the range of 1/2 to 15/1.

7. A positive working photosensitive composition as in claim 1, wherein the quinonediazide ester compound represented by general formula (I) or (II) has a molecular weight in the range of 400 to 5,000.

* * * * *